United States Patent
Dutta et al.

(10) Patent No.: US 10,340,289 B2
(45) Date of Patent: Jul. 2, 2019

(54) CASCODE RADIO FREQUENCY (RF) POWER AMPLIFIER ON SINGLE DIFFUSION

(71) Applicant: QUALCOMM INCORPORATED, San Diego, CA (US)

(72) Inventors: Ranadeep Dutta, Del Mar, CA (US); Antonino Scuderi, San Diego, CA (US); Wing Sy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1 day.

(21) Appl. No.: 15/581,254

(22) Filed: Apr. 28, 2017

(65) Prior Publication Data

US 2018/0315773 A1 Nov. 1, 2018

(51) Int. Cl.
*H01L 27/12* (2006.01)
*H01L 29/78* (2006.01)
*H01L 21/8238* (2006.01)
*H03F 3/195* (2006.01)
*H03F 3/24* (2006.01)
*H03F 1/22* (2006.01)

(52) U.S. Cl.
CPC ...... *H01L 27/1203* (2013.01); *H01L 21/8238* (2013.01); *H01L 29/7824* (2013.01); *H03F 1/223* (2013.01); *H03F 3/195* (2013.01); *H03F 3/245* (2013.01); *H03F 2200/451* (2013.01)

(58) Field of Classification Search
CPC . H01L 21/8238; H01L 27/1203; H01L 29/78; H01L 29/7824
USPC ...................................................... 257/337
See application file for complete search history.

(56) References Cited

U.S. PATENT DOCUMENTS

| 6,504,433 | B1 | 1/2003 | Weber et al. |
| 6,784,500 | B2 | 8/2004 | Lemkin |
| 7,071,785 | B2 | 7/2006 | Behzad et al. |
| 8,753,941 | B1* | 6/2014 | Benaissa ......... H01L 21/823814 |
| | | | 257/358 |
| 9,153,691 | B1 | 10/2015 | Dutta et al. |
| 2004/0031996 | A1* | 2/2004 | Brian Li ............. H01L 29/1087 |
| | | | 257/408 |
| 2005/0088242 | A1* | 4/2005 | Behzad ................. H03F 1/0205 |
| | | | 330/311 |
| 2008/0224221 | A1* | 9/2008 | Yang ............... H01L 21/823425 |
| | | | 257/365 |
| 2009/0283826 | A1* | 11/2009 | Shea .................... H01L 29/1095 |
| | | | 257/336 |

(Continued)

FOREIGN PATENT DOCUMENTS

CN 102904534 A 1/2013

OTHER PUBLICATIONS

Annema A-J., et al., "Analog Circuits in Ultra-Deep-Submicron CMOS," IEEE Journal of Solid-State Circuits, vol. 40, No. 1, Jan. 2005, pp. 132-143.

(Continued)

*Primary Examiner* — Fazli Erdem
(74) *Attorney, Agent, or Firm* — Smith Tempel Blaha LLC/Qualcomm

(57) ABSTRACT

An amplifier includes a cascode structure comprising a first transistor having first characteristics coupled to a second transistor having second characteristics different than the first characteristics, the first transistor formed with the second transistor on a single diffusion.

28 Claims, 11 Drawing Sheets

(56) References Cited

U.S. PATENT DOCUMENTS

| | | | |
|---|---|---|---|
| 2012/0175679 A1* | 7/2012 | Marino | H01L 29/402 |
| | | | 257/194 |
| 2012/0211812 A1* | 8/2012 | Du | H01L 29/0653 |
| | | | 257/296 |
| 2015/0035072 A1* | 2/2015 | Dutta | H01L 21/823857 |
| | | | 257/369 |
| 2015/0243764 A1* | 8/2015 | Yin | H01L 29/66772 |
| | | | 438/151 |
| 2016/0126906 A1* | 5/2016 | Maxim | H04W 72/04 |
| | | | 330/296 |

OTHER PUBLICATIONS

Bon O., et al., "RF Power NLDMOS Technology Transfer Strategy from the 130nm to the 65nm node on thin SOI", IEEE International SOI Conference Proceedings, Oct. 2007, pp. 61-62.

Pornpromlikit S., et al., "A Watt-Level Stacked-FET Linear Power Amplifier in Silicon-on-Insulator CMOS," IEEE Transactions on Microwave Theory and Techniques, Jan. 2010, vol. 58, No. 1, pp. 57-64.

\* cited by examiner

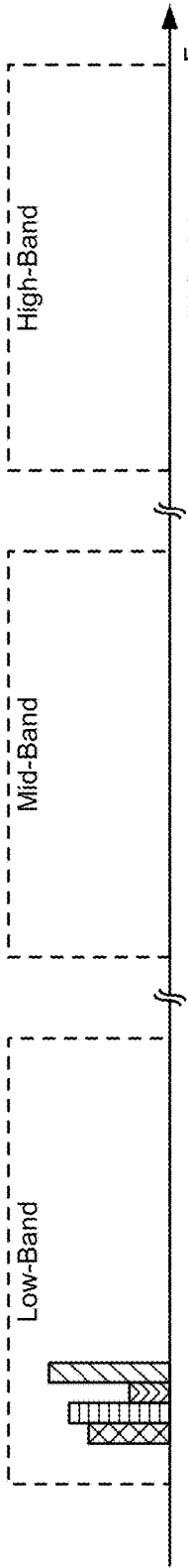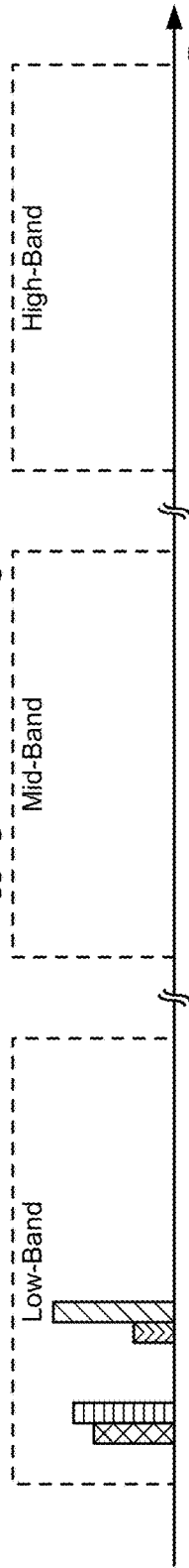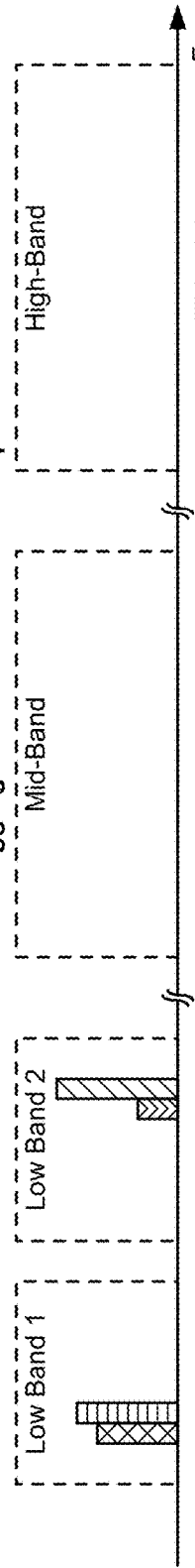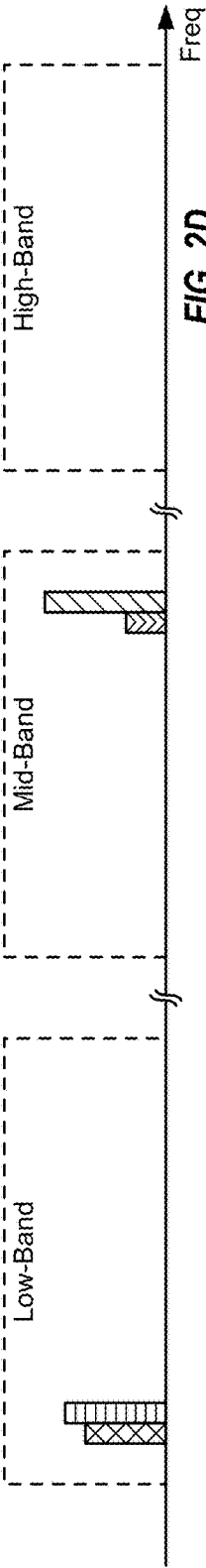

US 10,340,289 B2

CASCODE RADIO FREQUENCY (RF) POWER AMPLIFIER ON SINGLE DIFFUSION

FIELD

The present disclosure relates generally to electronics, and more specifically to power amplifiers.

BACKGROUND

In a radio frequency (RF) transceiver, a communication signal is typically amplified and transmitted by a transmit section. A transmit section may comprise one or more circuits that amplify and transmit the communication signal. The amplifier circuit or circuits may comprise one or more amplifier stages that may include one or more driver stages and one or more power amplifier stages. Each of the amplifier stages typically comprises one or more transistors configured in various ways to amplify the communication signal. An example of a power amplifier architecture is referred to as a cascode transistor architecture. When implemented using metal oxide semiconductor (MOS) technology, a cascode transistor architecture generally uses two transistor amplifiers, one operating as a common-source stage and the other operating as a common-gate stage. A cascode transistor amplifier is generally characterized by a high gain, moderately high input impedance, a high output impedance, and a high bandwidth. Typically, when implemented using a complementary metal oxide semiconductor (CMOS) process, a cascode transistor architecture provides high voltage capability for CMOS based power amplifiers and switches, but it also undesirably occupies a large amount of silicon (Si) die area.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an amplifier including a cascode structure comprising a first transistor having first characteristics coupled to a second transistor having second characteristics different than the first characteristics, the first transistor formed with the second transistor on a single diffusion.

Another aspect of the disclosure provides a cascode amplifier including a first transistor configured as a transconductance N-type metal oxide semiconductor (NMOS) transistor, and a second transistor configured as a high-voltage N-type metal oxide semiconductor (NMOS) transistor, the first transistor and the second transistor formed on a single diffusion, wherein a gate oxide thickness of the first transistor is different than a gate oxide thickness of the second transistor.

Another aspect of the disclosure provides a cascode amplifier including a first transistor configured as a transconductance N-type metal oxide semiconductor (NMOS) transistor, and a second transistor configured as a high-voltage N-type metal oxide semiconductor (NMOS) transistor, the first transistor and the second transistor formed on a single diffusion, wherein a channel length of the first transistor is different than a channel length of the second transistor.

Another aspect of the disclosure provides a method for forming an amplifier including a cascode structure comprising a first transistor having first characteristics and a second transistor having second characteristics integrated on a single diffusion, Another aspect of the disclosure provides a device including means for forming a cascode structure comprising a first transistor having first characteristics and a second transistor having second characteristics formed on a single silicon diffusion and means for integrating the first transistor with the second transistor on the single diffusion.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 2A is a graphical diagram showing an example of contiguous intra-band carrier-aggregation (CA).

FIG. 2B is a graphical diagram showing an example of non-contiguous intra-band CA.

FIG. 2C is a graphical diagram showing an example of inter-band CA in the same band group.

FIG. 2D is a graphical diagram showing an example of inter-band CA in different band groups.

DETAILED DESCRIPTION

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to a cascode radio frequency (RF) power amplifier on a single diffusion and elements thereof, for example a cascode transistor structure configured as an RF power amplifier that can be fabricated on a single semiconductor diffusion and elements thereof.

Figure 1:
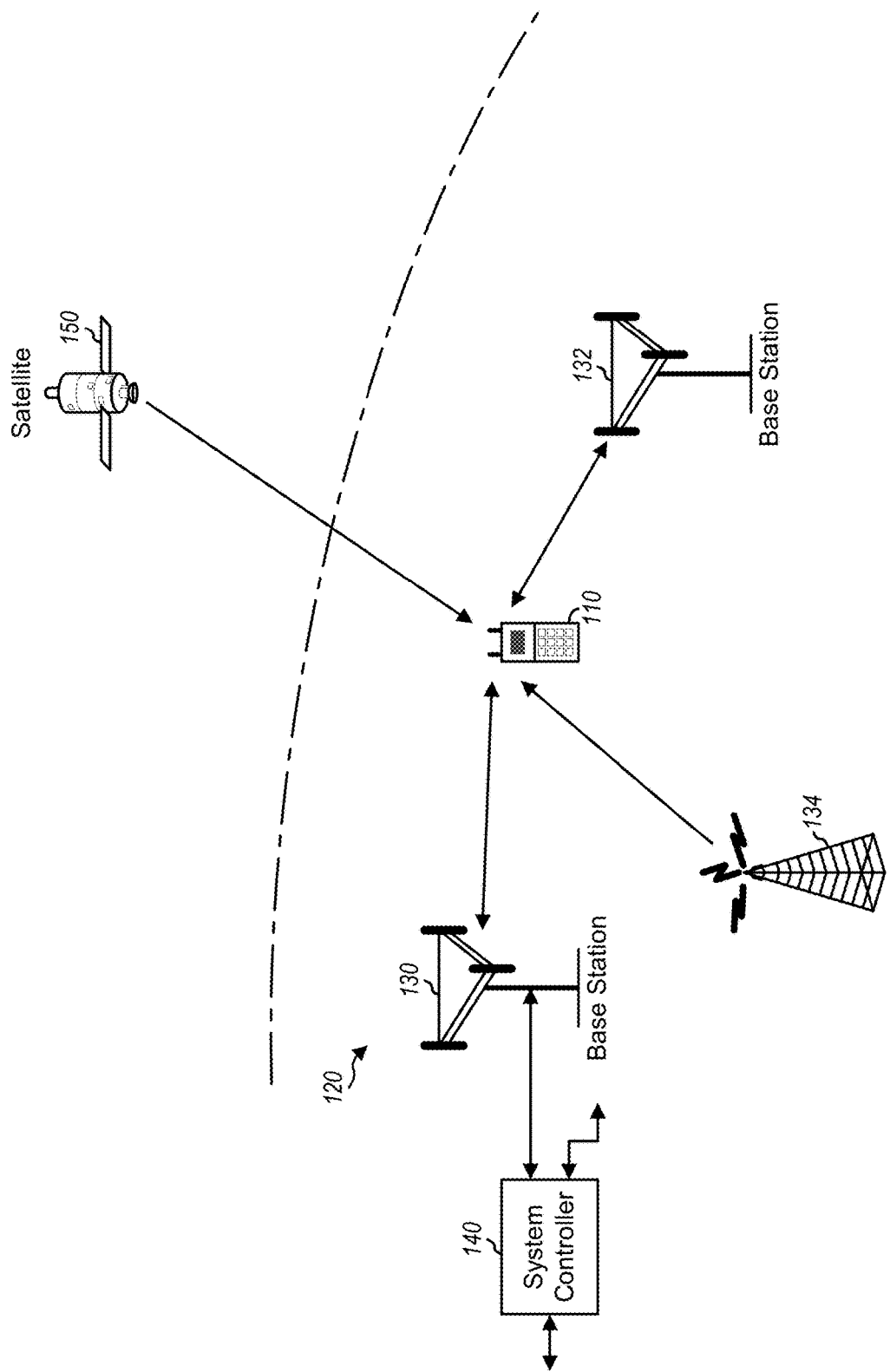
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
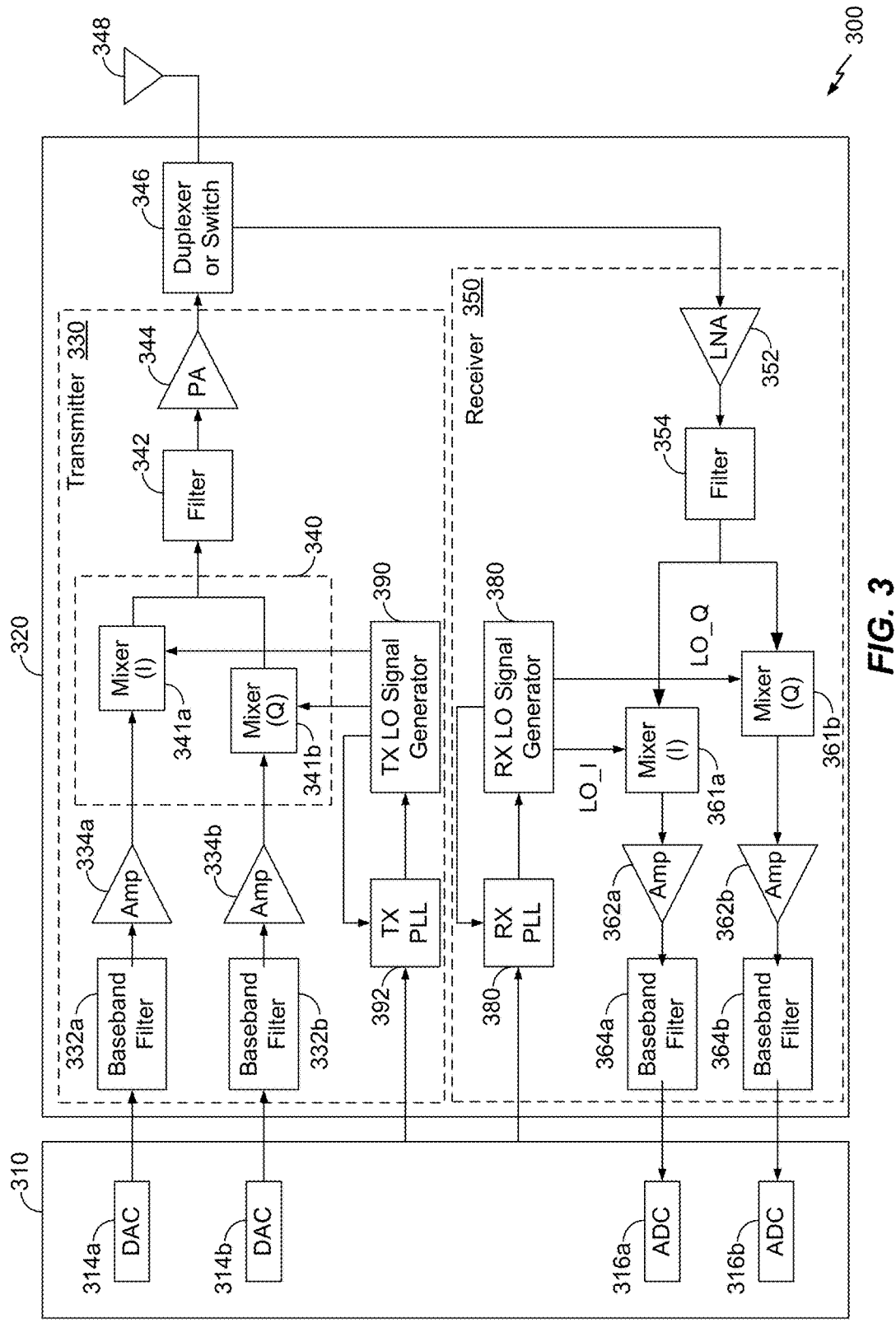
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Down-conversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

The power amplifier 344 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 344 can be configured to operate using one or more bias signals and can be configured in various topologies or architectures, one such architecture being a cascode configuration.

In an exemplary embodiment of the present disclosure, a cascode radio frequency (RF) power amplifier may be configured as a cascode transistor structure formed on a single diffusion and may be incorporated with or into the power amplifier 344 to provide RF power amplification. In a particular exemplary embodiment, a cascode radio frequency (RF) power amplifier may be configured as one or more cascode amplifier stages on a single diffusion to provide power amplification to the radio frequency (RF) input signal. Those of skill in the art, however, will recognize that aspects of the cascode radio frequency (RF) power amplifier described herein may be implemented in transmit architectures which differ from the architecture illustrated in FIG. 3 and may be implemented in other devices in which RF power amplification is desired.

The power amplifier 344 may comprise one or more driver and amplifier stages. Some or all of these stages may be implemented with a CMOS power amplifier arranged in a cascode configuration. Although the two cascode transistors may be fabricated using the CMOS process, heretofore they have been fabricated on different semiconductor diffusions on the silicon (Si) die. As will be described below, embodiments of the cascode RF power amplifier may be configured to allow the formation of two cascode transistors on the same diffusion within the Si die. Moreover, embodiments of the cascode RF power amplifier device may comprise the power amplifier 344 or may be integrated within the power amplifier 344.

Figure 4:
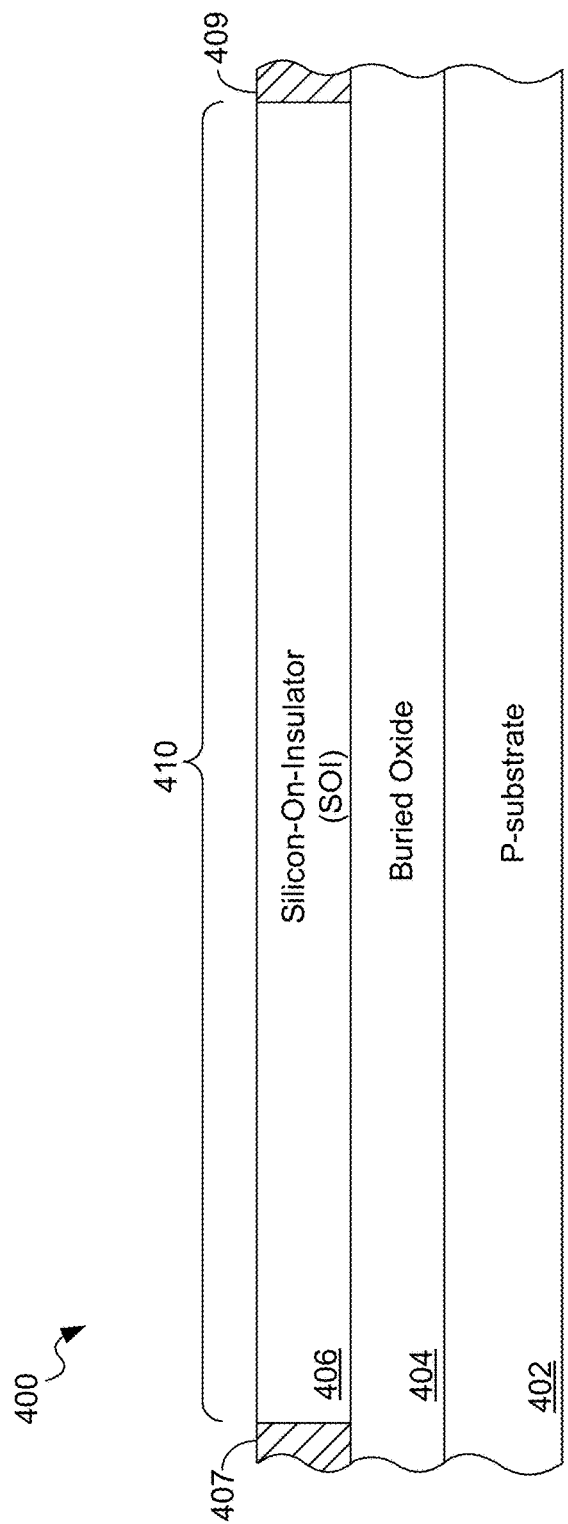
FIG. 4 is a schematic diagram illustrating an exemplary embodiment of a semiconductor structure on which embodiments of the cascode radio frequency (RF) power amplifier may be formed.

FIG. 4 is a schematic diagram illustrating an exemplary embodiment of a semiconductor structure on which embodiments of the cascode radio frequency (RF) power amplifier may be formed. A semiconductor structure 400 may be referred to as a wafer, a die, a handle wafer, or another structure. In an exemplary embodiment, the semiconductor structure 400 may comprise a substrate 402 over which a buried oxide layer 404 may be formed. In an exemplary embodiment, the substrate 402 may be formed of a P-type material, or an N-type material, and in the embodiment shown in FIG. 4, may be a P-type material.

The buried oxide layer 404 may be any oxide material. A silicon-on-insulator (SOI) layer 406 may be formed over the buried oxide layer 404 using techniques known to those skilled in the art. In an exemplary embodiment, shallow trench isolation (STI) regions 407 and 409 may be formed in the SOI layer 406 to define a single diffusion 410 in the SOI layer 406. The shallow trench isolation regions 407 and 409 electrically isolate devices (not shown) formed in the single diffusion 410 from other devices.

As will be described herein, a cascode RF power amplifier may be formed using a cascode transistor structure formed in the single diffusion 410. As alluded to above, the semiconductor structure 400 may be incorporated with or into a power amplifier, for example the power amplifier 344. In an exemplary embodiment, the P-type substrate 402 may be configured to allow the formation of N-type metal oxide semiconductor (NMOS) devices in the single diffusion 410. In other exemplary embodiments, P-type metal oxide semiconductor (PMOS) devices can be formed over an N-type substrate.

Figure 5:
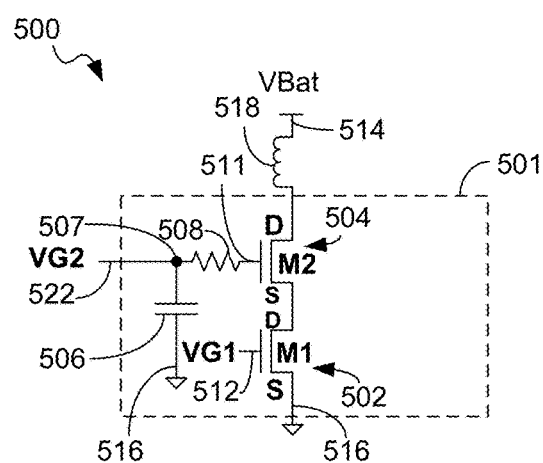
FIG. 5 is a schematic diagram illustrating an exemplary embodiment of a cascode transistor structure that may be fabricated as a radio frequency (RF) power amplifier on a single diffusion.

FIG. 5 is a schematic diagram 500 illustrating an exemplary embodiment of a cascode transistor structure 501 that may be fabricated as a cascode radio frequency (RF) power amplifier on a single diffusion. When implemented using metal oxide semiconductor (MOS) technology, a cascode transistor structure generally uses two transistor amplifiers having different characteristics, one operating as a common-source stage and the other operating as a common-gate stage. In an exemplary embodiment, the cascode structure 501 comprises a metal oxide semiconductor (MOS) transistor 502 (M1) configured as the common-source stage and a high-voltage MOS (HV MOS) transistor 504 (M2) configured as the common-gate stage. In an exemplary embodiment, the transistor 504 enables the cascode structure 501 to withstand large voltage swings, whereas the transistor 502 provides a high gain across the full range of the operating voltage of the cascode structure 501. In an exemplary embodiment, the MOS transistor 502 comprises a transconductance MOS transistor configured to convert an input voltage to an output current. A drain of the transistor 504 is coupled to an inductor 518, which may be coupled to a voltage source 514, illustrated as VBat. The source of the transistor 504 may be coupled to the drain of the transistor 502. The source of the transistor 502 may be coupled to a common terminal 516. In an exemplary embodiment, the common terminal 516 may a ground connection. A gate 512 of the transistor 502 may be referred to as G1 and may be configured to receive a gate voltage, VG1. A gate 511 of the transistor 504 may be coupled to a resistor 508 at node 507, may be referred to as G2, and may be configured to receive a gate voltage, VG2. A capacitor 506 may be coupled between the node 507 and the common terminal 516. In an exemplary embodiment, the transistors 502 and 504 may be fabricated using a complementary metal oxide semiconductor (CMOS) manufacturing process.

The metal oxide semiconductor (MOS) transistor 502 (M1), high-voltage MOS transistor 504 (M2), resistor 508 and capacitor 506 may be part of the cascode structure 501 that may be defined within the single diffusion 401 (FIG. 4). As will be described below, the elements within the cascode structure 501 are formed on the single diffusion 410 of FIG. 4.

Figure 6:
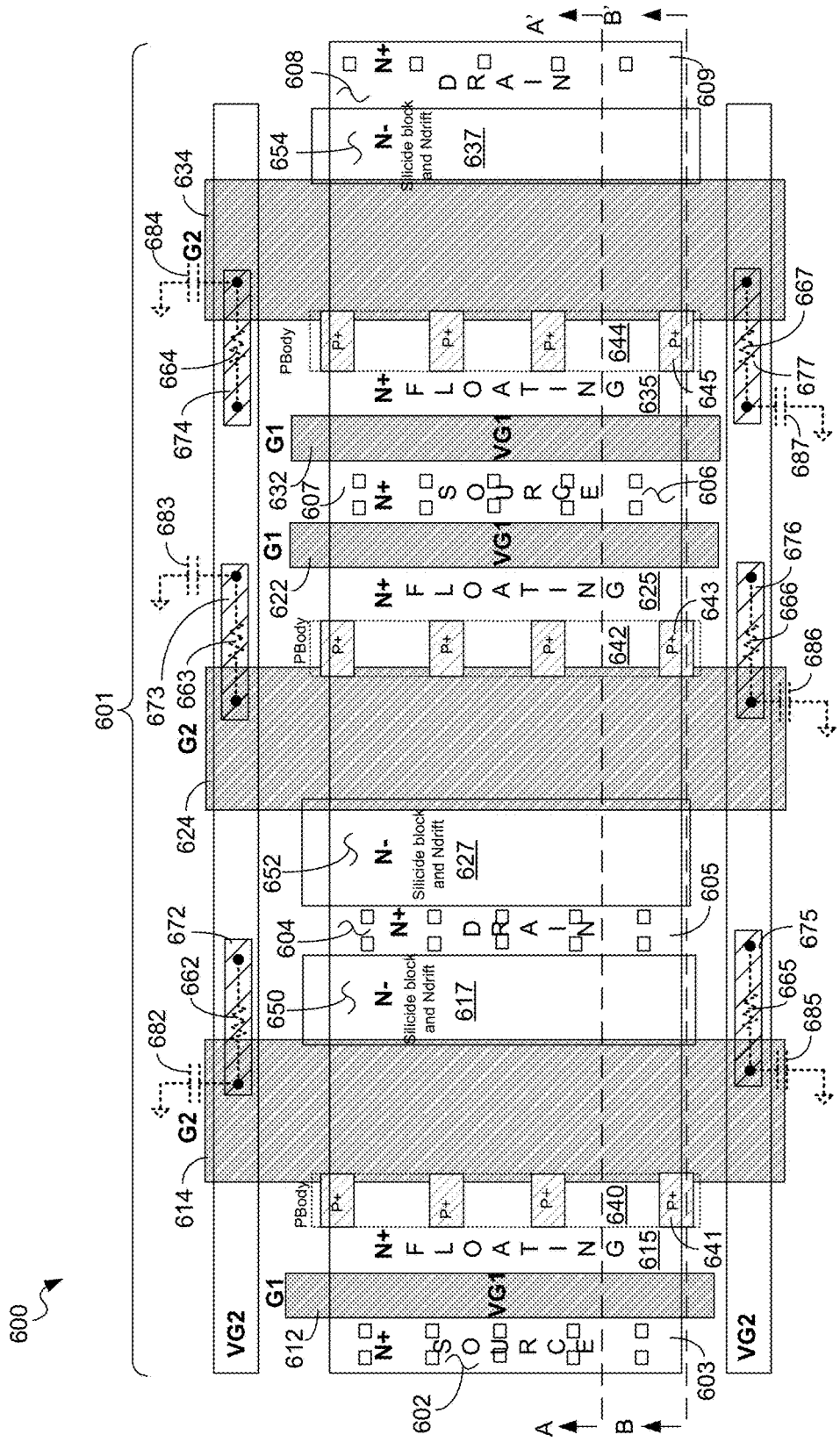
FIG. 6 is a plan view of an exemplary embodiment of a cascode transistor structure that may form a RF power amplifier on a single diffusion.

FIG. 6 is a plan view 600 of an exemplary embodiment of a cascode transistor structure 601 that may form a cascode RF power amplifier on a single diffusion. In an exemplary embodiment, the cascode structure 601 is implemented in a single diffusion on a semiconductor structure having a P-type substrate (such as the semiconductor substrate 400 shown in FIG. 4), and generally comprises N-type MOS devices. However, in alternative exemplary embodiments, P-type MOS devices may also be fabricated on a semiconductor structure having an N-type substrate.

In an exemplary embodiment, the cascode structure 601 comprises a highly doped N+ region 602 that forms a source 603 of the cascode structure 601, a highly doped N+ region 604 that forms a drain 605 of the cascode structure 601, a highly doped N+ region 606 that forms a source 607 of the cascode structure 601 and a highly doped N+ region 608 that forms a drain 609 of the cascode structure 601. The region 604 and the region 606 form the connection between two cascode transistor devices, as will be described herein.

A highly doped N+ region 615 forms a floating diffusion region, a highly doped N+ region 625 forms a floating diffusion region, and a highly doped N+ region 635 forms a floating diffusion region. These floating diffusion regions have high conductivity without being tied to a specific potential.

A lightly doped N− region 617 forms an N-drift region covering a portion of the drain 605, a lightly doped N− region 627 forms an N-drift region covering a portion of the drain 605, and a lightly doped N− region 637 forms an N-drift region covering a portion of the drain 608. N-drift regions 617, 627 and 637 cover a portion of the drains 605 and 609 of the transistor 504 (M2). The remaining portions of the drains 605 and 609 comprise the highly doped N+ region 604 and the highly doped N+ region 608, respectively. Therefore the N-drift regions 617, 627 and 637, and the highly doped N+ regions 615, 625 and 635 are spatially complementary. The N-drift regions 617 and 627 cover the region between the edges of an adjacent first gate segment 614 and second gate segment 624, while the highly doped N+ region 604 comprises the drain 605. The N-drift regions 617 and 627 connect the highly doped N+ region 604 to the channel (not shown) on the drain side of the second transistor 504 (M2). Similarly, the N-drift region 637 covers the region between the edges of an adjacent third gate segment 634, while the highly doped N+ region 608 comprises the drain 609.

The lightly doped N− region 617 is generally covered by a dielectric material in the region 650, the dielectric material in the region 650 being configured as a silicide block. The lightly doped N− region 627 is generally covered by a dielectric material in the region 652, the dielectric material in the region 652 being configured as a silicide block, and the lightly doped N− region 637 is generally covered by a dielectric material in the region 654, the dielectric material in the region 654 being configured as a silicide block. The silicide block in the regions 650, 652 and 654 prevents silicide deposition on the gate segments (to be described below) and the drain regions 605 and 609.

A first gate segment 612, a second gate segment 622 and a third gate segment 632 comprise the gate (G1) 512 (FIG. 5) of the transistor 502 (FIG. 5). As used herein, the first gate segment 612, the second gate segment 622 and the third gate segment 632 may each be referred to as a "thin gate" or a "thin gate segment." In an exemplary embodiment, the first gate segment 612, the second gate segment 622 and the third gate segment 632 may comprise polysilicon.

A first gate segment 614, a second gate segment 624 and a third gate segment 634 comprise the gate (G2) 511 (FIG. 5) of the transistor 504 (FIG. 5). As used herein, the first gate segment 614, the second gate segment 624 and the third gate segment 634 may each be referred to as a "thick gate" or a "thick gate segment." In an exemplary embodiment, the first gate segment 614, the second gate segment 624 and the third gate segment 634 may comprise polysilicon. The term "thick" and the term "thin" are relative such that the thick gate segment may be thicker than a thin gate segment and a thin gate segment may be thinner than a thick gate segment.

In an exemplary embodiment, the first gate segment 612, the second gate segment 622 and the third gate segment 632, are formed with the first gate segment 614, the second gate segment 624 and the third gate segment 634. In an exemplary embodiment, forming the first gate segment 612, the second gate segment 622 and the third gate segment 632 as show may be referred to as "interdigitating" the first gate segment 612, the second gate segment 622 and the third gate segment 632. In an exemplary embodiment, interdigitating the first gate segment 612, the second gate segment 622 and the third gate segment 632, as shown with the first gate segment 614, the second gate segment 624 and the third gate segment 634 reduces an amount of area occupied by the cascode structure 601 when compared to cascode structures having non-interdigitated gate segments. As used here, the term interdigitated refers to coupling like or unlike transistors 502 (M1) and 504 (M2) in a cascode structure on the same single diffusion 410. The interdigitated cascode transistors 502 and 504 (FIG. 5) provide significantly high power density (approximately +40% demonstrated) without compromising efficiency and uniform temperature distribution, compared to a cascode structure formed on more than a single diffusion 410.

A P body region 640 extends from the highly doped N+ region 615 to and slightly overlaps the first gate segment 614, a P body region 642 extends from the highly doped N+ region 625 to and slightly overlaps the second gate segment 624, and a P body region 644 extends from the highly doped N+ region 635 to and slightly overlaps the third gate segment 624. Exemplary P+ islands, exemplary ones of which are illustrated using reference numerals 641, 643 and 645, are implanted in the P body regions 640, 642 and 644, respectively, and extend to and slightly overlap the first gate segment 614, the second gate segment 624 and the third gate segment 624, respectively. In an exemplary embodiment, the P body regions 640, 642 and 644 overlap respective first gate segment 614, second gate segment 624 and third gate segment 624 by approximately 100 nanometers (nm), but this overlap may be different for different applications. The exemplary P+ islands, 641, 643 and 645, and the other P+ islands in the P body regions 640, 642 and 644, respectively, overlap the respective first gate segment 614, the second gate segment 624 and the third gate segment 624 by approximately 100 nm, similarly with respect to the P body regions 640, 642 and 644, but this overlap may be different for different applications. In an alternative exemplary embodiment, the exemplary P+ islands, 641, 643 and 645, and the other P+ islands in the P body regions 640, 642 and 644, respectively, may not overlap the respective first gate segment 614, second gate segment 624 and third gate segment 624.

In an alternative embodiment, the first gate segment 614, the second gate segment 624 and the third gate segment 624 can be extended beyond the first gate segment 612, the second gate segment 622 and the third gate segment 632. In this exemplary embodiment, the first gate segment 614, the second gate segment 624 and the third gate segment 624 can be fabricated to allow the formation of exemplary resistances 662, 663, 664, 665, 666 and 667. The exemplary resistances 662, 663, 664, 665, 666 and 667 are depicted in dotted line to indicate that these are resistances formed by polysilicon regions 672, 673, 674, 675, 676 and 677 that may comprise additional segments of polysilicon, in addition to the polysilicon of the gate segments 614, 624 and 634, and are not discrete resistors. In such an exemplary embodiment, and variations thereof, the first gate segment 614, the second gate segment 624 and the third gate segment 624 can be wider than the first gate segment 612, second gate segment 622 and third gate segment 632 as shown and coupled together with the polysilicon regions 672, 673, 674, 675, 676 and 677 to create series-resistances associated with each thick gate (G2), the series resistances also being referred to as "stability resistances" In an exemplary embodiment, a stability resistance is a dissipative element coupled in series with the gate (G2) of the high voltage device, transistor 504 (M2), such as the resistor 508 of FIG. 5, and is configured to remove or reduce instabilities associated with the thick gate of the transistor 504 (M2). In an exemplary embodiment, the exemplary resistances 662, 663, 664, 665, 666 and 667 may be connected in parallel.

In an exemplary embodiment, exemplary shunt capacitances 682, 683, 684, 685, 686 and 687 can also be integrated and coupled in parallel between the first gate segment 614, the second gate segment 624 and the third gate segment 624 and ground. The exemplary shunt capacitances 682, 683, 684, 685, 686 and 687 are depicted in dotted line to indicate that these are elements of the same capacitance having the sum of six parallel-connected capacitances in this exemplary embodiment.

Figure 7:
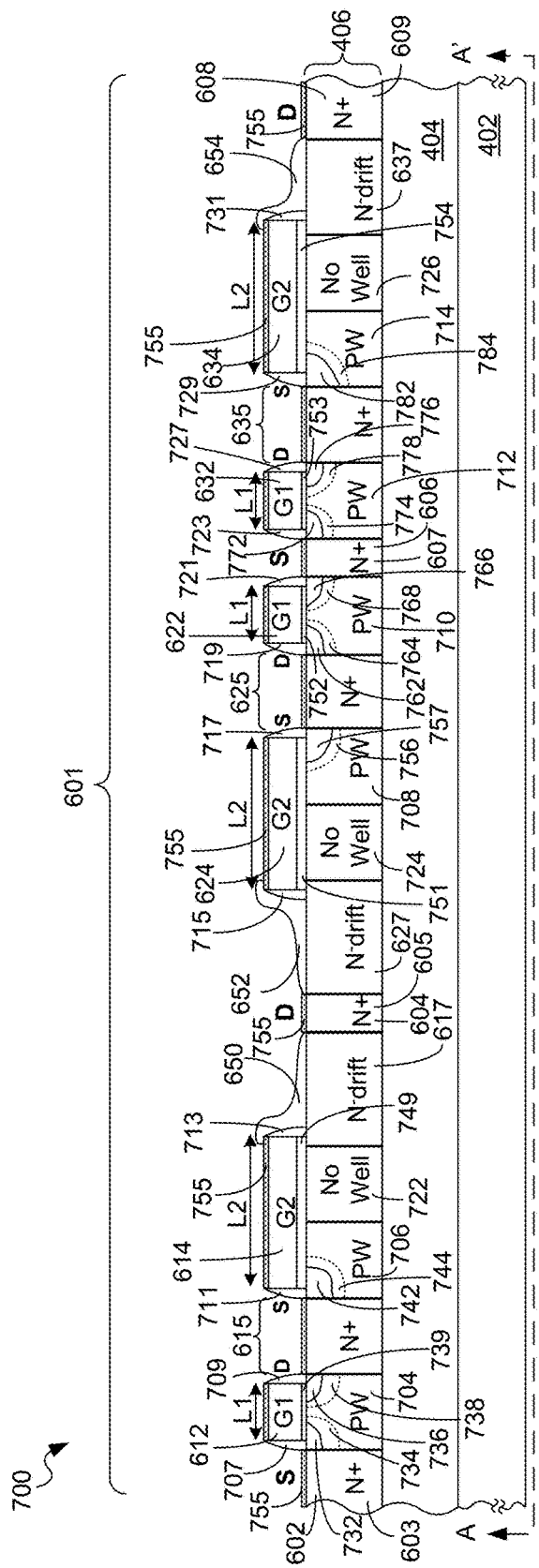
FIG. 7 is a cross-sectional view of the exemplary embodiment of the cascode transistor structure of FIG. 6 through section AA'.

FIG. 7 is a cross-sectional view 700 of the exemplary embodiment of the cascode transistor structure 601 of FIG. 6 through section AA'. None of the contacts or backside layers of the cascode structure 601 are shown in FIG. 7, or other figures herein, including contacts, multi-layer metallization and passivation. The cross-sectional view 700 illustrates an exemplary embodiment of a cascode RF power amplifier that may be formed on the SOI layer 406 above the buried oxide layer 404 (FIG. 4) in the single diffusion 410.

The view 700 includes the highly doped N+ region 602 adjoining a P-type well region 704. In an exemplary embodiment, the highly doped N+ region 602 forms the source 603 of the transistor 502 (FIG. 5). The P-type well region 704 adjoins the highly doped N+ region 615, which forms a floating diffusion region. Another P-type well region 706 adjoins the highly doped N+ region 615. A "no well" region 722 adjoins the P-type well region 706. The "no well" region 722 may be lightly doped P-type, and may comprise the native state of the SOI layer 406 of FIG. 4. The lightly doped N− region 617 that forms an N-drift region adjoins the no well region 722. The lightly doped N− region 617 that forms an N-drift region also adjoins the highly doped N+ region 604. The highly doped N+ region 604 forms a drain 605 of the cascode structure 601 (FIG. 6). The lightly doped N− region 617 that forms the N-drift region connects the drain 605 formed by the highly doped N+ region 604 to the channel (not shown) formed below the first gate segment 614 (G2).

The first gate segment 612 (G1) is formed over a gate oxide layer 739. The first gate segment 614 (G2) is formed over a gate oxide layer 749. The gate oxide layer 739 may have a thickness that is the same or that is different than a thickness of the gate oxide layer 749. In an exemplary embodiment, a thickness of the gate oxide layer 739 may range from approximately 10 A (Angstroms) to approximately 40 A, and a thickness of the gate oxide layer 749 may range from approximately 40 A to approximately 100 A. In an exemplary embodiment, the gate oxide layer 749 may be thicker than the gate oxide layer 739, where each of the gate oxide layer 739 and the gate oxide layer 749 may be independently optimized to optimize the performance of the cascode transistor structure 501 (FIG. 5).

In an exemplary embodiment, the length, L1, of the first gate segment 612 (G1) may be different than the length, L2, of the first gate segment 614 (G2), giving rise to different channel lengths for the transistor 502 and the transistor 504 (FIG. 5). As known to those having ordinary skill in the art, a conductive channel may be established or de-established under the gate segment of a transistor under certain operating conditions. In an exemplary embodiment, the length, L1, may be, for example, approximately 40 nanometers (nm) to approximately 180 nm and the length, L2, may be, for example, approximately 180 nanometers (nm) to approximately 500 nm.

In an exemplary embodiment, the two separate gate oxide thicknesses, and the two separate gate lengths enable the separate functions of the first transistor 502 (M1) and transistor 504 (M2), whereby the first transistor 502 (M1) provides high gain and the second transistor 504 (M2) sustains the high output voltage swing. In an exemplary embodiment, the oxide thicknesses of the gate segments 612, 622 and 632 may be the same and the oxide thicknesses of the gate segments 614, 624 and 634 may be the same.

A silicide material 755 covers all of the the N+ regions, P+ regions and gate segments. A spacer 707 extends from the top of the silicide material 755 covering the first gate segment 612 (G1) to the silicide material 755 covering the highly doped N+ region 602. A spacer 709 extends from the top of the silicide material 755 covering the first gate segment 612 (G1) to the silicide material 755 covering the highly doped N+ region 615.

A spacer 711 extends from the top of the silicide material 755 covering the first gate segment 614 (G2) to the silicide material 755 covering the highly doped N+ region 615. A spacer 713 extends from the top of the silicide material 755 covering the first gate segment 614 (G2) to the top of the lightly doped N− region 617 that forms the N-drift region.

A dielectric material 650 covers the lightly doped N− region 617 and extends from the top of the silicide material 755 covering the first gate segment 614 (G2) to the silicide material 755 covering the highly doped N+ region 604. The dielectric material 650 prevents silicide deposition on the drain side of the first gate segment 614 and the highly doped N+ region 604.

An N-type lightly doped drain/source (NLDDS) region 732 is formed in the P-type well region 704 between the gate oxide layer 739 and the highly doped N+ region 602, and can be referred to as a source NLDDS. An N-type lightly doped drain/source (NLDDS) region 736 is formed in the P-type well region 704 between the gate oxide layer 739 and the highly doped N+ region 615, and can be referred to as a drain NLDDS. An n-type pocket (also referred to as a halo) region 734 is formed below the source NLDDS 732, between the gate oxide layer 739 and the highly doped N+ region 602, and an n-type pocket (halo) region 738 is formed below the drain NLDDS 736, between the gate oxide layer 739 and the highly doped N+ region 615.

An N-type lightly doped drain/source (NLDDS) region 742 is formed in the P-type well region 706 between the gate oxide layer 749 and the highly doped N+ region 615, and can be referred to as a source NLDDS. An n-type pocket (also referred to as a halo) region 744 is formed below the source NLDDS 742, between the gate oxide layer 749 and the highly doped N+ region 615. In accordance with an exemplary embodiment of the cascode RF power amplifier on a single diffusion, the source NLDDS 732 and the drain NLDDS 736 below the first gate segment 612 (G1) may be shallower than the source NLDDS 742 below the first gate segment 614 (G2). In an alternative exemplary embodiment, the source NLDDS 732 and the drain NLDDS 736 below the first gate segment 612 (G1) may be formed to the same depth as the source NLDDS 742 below the first gate segment 614 (G2).

In an exemplary embodiment, the highly doped N+ region 615 comprising a floating diffusion covers the source side of the first gate segment 614 (G2) (that is, the source of the HV NMOS transistor 504), and covers the drain side of the first gate segment 612 (G1) (that is, the drain of the NMOS transistor 502).

A lightly doped N− region 627 forms an N-drift region that adjoins the highly doped N+ region 604. A no well region 724 adjoins the lightly doped N− region 627. The no well region 724 is similar to the no well region 722. A P-type well region 708 adjoins the no well region 724. The highly doped N+ region 625, which forms a floating diffusion region, adjoins the P-type well region 708. A P-type well region 710 adjoins the highly doped N+ region 625. The highly doped N+ region 606 adjoins the P-type well region 710. The highly doped N+ region 606 forms a source 607 of the cascode structure 601 (FIG. 6). The lightly doped N− region 627 that forms the N-drift region connects the drain 605 formed by the highly doped N+ region 604 to the channel (not shown) formed below the second gate segment 624 (G2).

The second gate segment 622 (G1) is formed over a gate oxide layer 752. The second gate segment 624 (G2) is formed over a gate oxide layer 751. The gate oxide layer 752 may have a thickness that is the same or that is different than a thickness of the gate oxide layer 751, as described above with respect to the gate oxide layer 739 and the gate oxide layer 749, respectively. In an exemplary embodiment, the gate oxide layer 751 may be thicker than the gate oxide layer 752, where each of the gate oxide layer 751 and the gate oxide layer 752 may be independently optimized, as described above.

In an exemplary embodiment, the length, L1, of the second gate segment 622 (G1) may be different than the length, L2, of the second gate segment 624 (G2), giving rise to different channel lengths for the transistor 502 and the transistor 504 (FIG. 5), as described above.

A silicide material 755 covers the N+ regions, P+ regions and gate segments. A spacer 715 extends from the top of the silicide material 755 covering the second gate segment 624 (G2) to the top of the lightly doped N− region 627 that forms the N-drift region. A spacer 717 extends from the top of the silicide material 755 covering the second gate segment 624 (G2) to the silicide material 755 covering the highly doped N+ region 625.

A spacer 719 extends from the top of the silicide material 755 covering the second gate segment 622 (G1) to the silicide material 755 covering the highly doped N+ region 625. A spacer 721 extends from the top of the silicide material 755 covering the second gate segment 622 (G1) to the top of the highly doped N+ region 606.

A dielectric material 652 covers the lightly doped N− region 627 and extends from the top of the silicide material 755 covering the second gate segment 624 (G2) to the silicide material 755 covering the highly doped N+ region 604. The dielectric material 652 prevents silicide deposition on the drain side of the second gate segment 624 and the highly doped N+ region 604.

An N-type lightly doped drain/source (NLDDS) region 757 is formed in the P-type well region 708 between the gate oxide layer 751 and the highly doped N+ region 625, and can be referred to as a source NLDDS. An N-type lightly doped drain/source (NLDDS) region 762 is formed in the P-type well region 710 between the gate oxide layer 752 and the highly doped N+ region 625, and can be referred to as a drain NLDDS. An n-type pocket (also referred to as a halo) region 756 is formed below the source NLDDS 757, between the gate oxide layer 751 and the highly doped N+ region 625, and an n-type pocket (halo) region 764 is formed below the drain NLDDS 762, between the gate oxide layer 752 and the highly doped N+ region 625.

An N-type lightly doped drain/source (NLDDS) region 766 is formed in the P-type well region 710 between the gate oxide layer 752 and the highly doped N+ region 606, and can be referred to as a source NLDDS. An n-type pocket (also referred to as a halo) region 768 is formed below the source NLDDS 766, between the gate oxide layer 752 and the highly doped N+ region 606. In accordance with an exemplary embodiment of the cascode RF power amplifier on a single diffusion, the source NLDDS 766 and the drain NLDDS 762 below the second gate segment 622 (G1) may be shallower than the source NLDDS 757 below the second gate segment 624 (G2). In an alternative exemplary embodiment, the source NLDDS 766 and the drain NLDDS 762 below the second gate segment 622 (G1) may be formed to the same depth as the source NLDDS 757 below the second gate segment 624 (G2).

In an exemplary embodiment, the highly doped N+ region 625 comprising a floating diffusion covers the source side of the second gate segment 624 (G2) (that is, the source of the HV NMOS transistor 504), and covers the drain side of the second gate segment 622 (G1) (that is, the drain of the NMOS transistor 502).

The highly doped N+ region 606 adjoins a P-type well region 712. The P-type well region 712 adjoins the highly doped N+ region 635, which forms a floating diffusion region. Another P-type well region 714 adjoins the highly doped N+ region 635. A no well region 726 adjoins the P-type well region 714. The no well region 726 is similar to the no well regions 722 and 724. The lightly doped N− region 637 that forms an N-drift region adjoins the no well region 726. The lightly doped N− region 637 that forms an N-drift region also adjoins the highly doped N+ region 608. The highly doped N+ region 608 forms a drain 609 of the cascode structure 601 (FIG. 6). The lightly doped N− region 637 that forms the N-drift region connects the drain 609 formed by the highly doped N+ region 608 to the channel (not shown) formed below the third gate segment 634 (G2).

The third gate segment 632 (G1) is formed over a gate oxide layer 753. The third gate segment 634 (G2) is formed over a gate oxide layer 754. The gate oxide layer 753 may have a thickness that is the same or that is different than a thickness of the gate oxide layer 754, as described above with respect to the gate oxide layer 739 and the gate oxide layer 749, respectively. In an exemplary embodiment, the gate oxide layer 754 may be thicker than the gate oxide layer 753, where each of the gate oxide layer 753 and the gate oxide layer 754 may be independently optimized, as described above.

In an exemplary embodiment, the length, L1, of the third gate segment 632 (G1) may be different than the length, L2, of the third gate segment 634 (G2), giving rise to different channel lengths for the transistor 502 and the transistor 504 (FIG. 5), as described above.

A silicide material 755 covers the N+ regions, P+ regions and gate segments. A spacer 723 extends from the top of the silicide material 755 covering the third gate segment 632 (G1) to the silicide material 755 covering the highly doped N+ region 606. A spacer 727 extends from the top of the silicide material 755 covering the third gate segment 632 (G1) to the silicide material 755 covering the highly doped N+ region 635.

A spacer 729 extends from the top of the silicide material 755 covering the third gate segment 634 (G2) to the silicide material 755 covering the highly doped N+ region 635. A spacer 731 extends from the top of the silicide material 755 covering the third gate segment 634 (G2) to the top of the lightly doped N− region 637 that forms the N-drift region.

A dielectric material 654 covers the lightly doped N− region 637 and extends from the top of the silicide material 755 covering the third gate segment 634 (G2) to the silicide material 755 covering the highly doped N+ region 608. The dielectric material 654 prevents silicide deposition on the drain side of the third gate segment 634 and the highly doped N+ region 608.

An N-type lightly doped drain/source (NLDDS) region 772 is formed in the P-type well region 712 between the gate oxide layer 753 and the highly doped N+ region 606, and can be referred to as a source NLDDS. An N-type lightly doped drain/source (NLDDS) region 776 is formed in the P-type well region 712 between the gate oxide layer 753 and the highly doped N+ region 635, and can be referred to as a drain NLDDS. An n-type pocket (also referred to as a halo) region 774 is formed below the source NLDDS 772, between the gate oxide layer 753 and the highly doped N+ region 606, and an n-type pocket (halo) region 778 is formed below the drain NLDDS 776, between the gate oxide layer 753 and the highly doped N+ region 635.

An N-type lightly doped drain/source (NLDDS) region 782 is formed in the P-type well region 714 between the gate oxide layer 754 and the highly doped N+ region 635, and can be referred to as a source NLDDS. An n-type pocket (also referred to as a halo) region 784 is formed below the source NLDDS 782, between the gate oxide layer 754 and the highly doped N+ region 635. In accordance with an exemplary embodiment of the cascode RF power amplifier on a single diffusion, the source NLDDS 772 and the drain NLDDS 776 below the third gate segment 632 (G1) may be shallower than the source NLDDS 782 below the third gate segment 634 (G2). In an alternative exemplary embodiment, the source NLDDS 772 and the drain NLDDS 776 below the third gate segment 632 (G1) may be formed to the same depth as the source NLDDS 782 below the third gate segment 634 (G2).

In an exemplary embodiment, the highly doped N+ region 635 comprising a floating diffusion covers the source side of the third gate segment 634 (G2) (that is, the source of the HV NMOS transistor 504), and covers the drain side of the third gate segment 632 (G1) (that is, the drain of the NMOS transistor 502).

Figure 8:
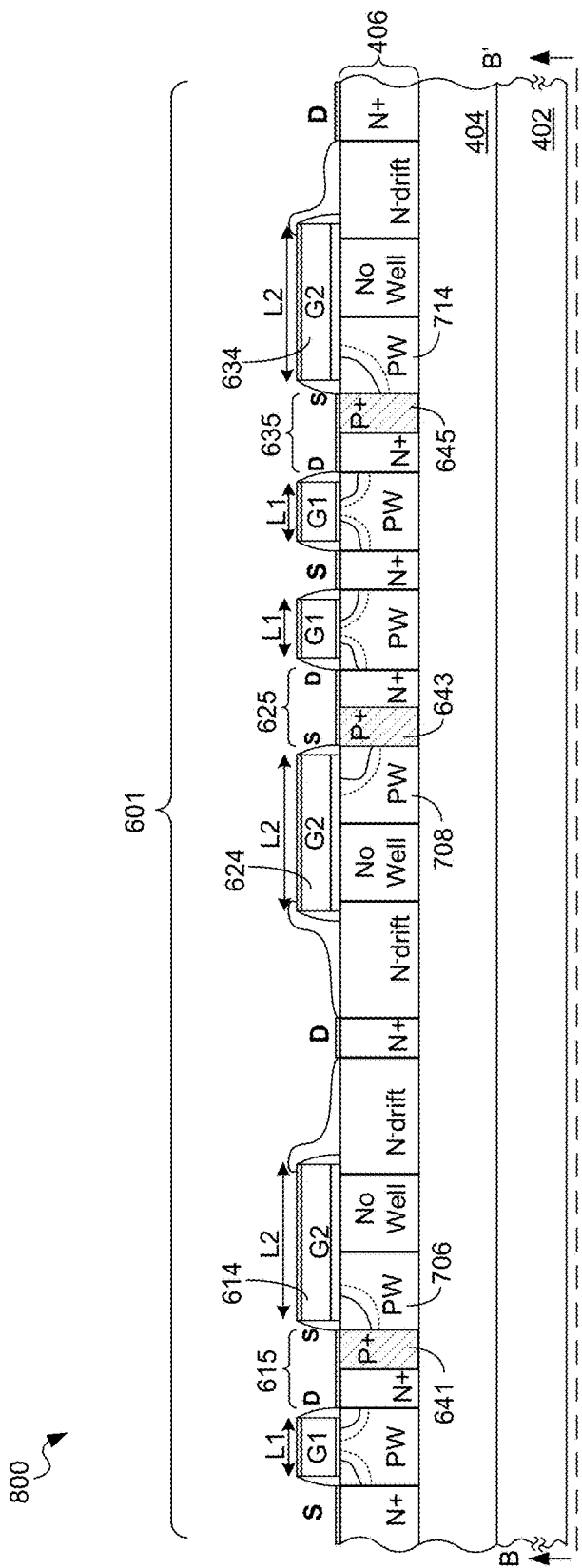
FIG. 8 is a cross-sectional view of the exemplary embodiment of the cascode transistor structure of FIG. 6 through section BB'.

FIG. 8 is a cross-sectional view 800 of the exemplary embodiment of the cascode transistor structure of FIG. 6 through section BB'. Elements in FIG. 8 that are identical to elements in FIG. 6 and FIG. 7 are not described again in detail. Moreover, some of the reference numerals for elements in FIG. 8 that are identical to elements in FIG. 7 are omitted from FIG. 8 to enhance clarity. In FIG. 8, the cross-section through line BB' of FIG. 6 illustrates the P+ islands, exemplary ones of which are illustrated using reference numerals 641, 643 and 645. As shown in FIG. 8, the P+ island 641 is located between the highly doped N+ region 615 that forms a floating diffusion region and the P-type well region 706. The P+ island 643 is located between the P-type well region 708 and the highly doped N+ region 625 that forms a floating diffusion region. The P+ island 645 is located between the highly doped N+ region 635 that forms a floating diffusion region and the P-type well region 714.

In an exemplary embodiment, the P body regions 640, 642 and 644 (shown in FIG. 6) are implanted in holes formed in the highly doped N+ region 615, the highly doped N+ region 625, and the highly doped N+ region 635, respectively. The P body regions 640, 642 and 644 cover a portion of the floating diffusion regions, are electrically floating, and are formed by a mask (not shown). Moreover, the respective P+ islands 641, 643, and 645 (and the other P+ islands shown in FIG. 6) are self-aligned to the polysilicon that forms the gate segments (G2). The term "self-aligned" refers to a feature being formed in relation to another feature that may be patterned onto the SOI. The patterned feature acts as a mask for these implanted features. For example, the gate segments 614, 624 and 634 may be patterned onto the SOI substrate so that the gate segments 614, 624 and 634 act as a mask for the implantation of the P+ islands 641, 643, and 645 (and the other P+ islands shown in FIG. 6).

The P body regions 640, 642 and 644 cover one side of the respective floating diffusion regions 615, 625 and 635 on the source side of the first gate segment 614, the second gate segment 624 and the third gate segment 634, respectively, of the transistor 504 (FIG. 5).

In an exemplary embodiment, the P+ islands 641, 643, and 645 create taps (i.e., electrical connections) that are interspersed with the highly doped N+ regions 615, 625 and 635 to create taps to the P body regions 640, 642 and 644, respectively. In accordance with an exemplary embodiment, the P+ islands 641, 643, and 645 help to form a robust electrical contact to the P body regions 640, 642 and 644, thus helping to prevent what is referred to as a "kink" effect, which may occur on a partially depleted SOI substrate. The term "kink" effect refers to a sharp rise in drain current when impact ionization is initiated in the drain region of a semiconductor.

In accordance with an exemplary embodiment, the highly doped N+ region 615, the highly doped N+ region 625 and the highly doped N+ region 635 are each covered by the silicide material 755 and remain not tied to a voltage potential. In an exemplary embodiment, the highly doped N+ region 615 is configured as a floating diffusion region comprising the P+ islands 641 interspersed within holes cut into the area of N+. In accordance with an exemplary embodiment, the floating diffusion regions 615, 625 and 635 are each configured having a respective P body implant 641, 642 and 644 covering a portion of the respective floating diffusion regions 615, 625 and 635.

Figure 9A:
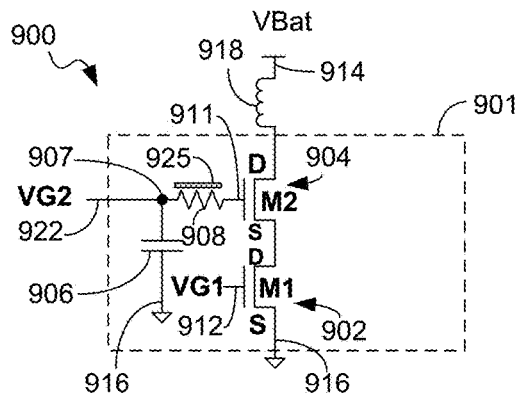
FIG. 9A is a schematic diagram illustrating an exemplary embodiment of a cascode transistor structure that may be fabricated as a radio frequency (RF) power amplifier on a single diffusion.

FIG. 9A is a schematic diagram 900 illustrating an exemplary embodiment of a cascode transistor structure that may be fabricated as a cascode radio frequency (RF) power amplifier on a single diffusion. The schematic diagram 900 is similar to the schematic diagram 500 of FIG. 5; but is used to more fully describe the resistances 662, 663, 664, 665, 666 and 667, and the capacitances 682, 683, 684, 685, 686 and 687 mentioned in FIG. 6.

The cascode structure 901 comprises a metal oxide semiconductor (MOS) transistor 902 (M1) configured as the common-source stage and a high-voltage MOS (HV MOS) transistor 904 (M2) configured as the common-gate stage. In an exemplary embodiment, the MOS transistor 902 is a transconductance MOS transistor. A drain of the transistor 904 is coupled to an inductor 918, which may be coupled to a voltage source 914, illustrated as VBat. The source of the transistor 904 may be coupled to the drain of the transistor 902. The source of the transistor 902 may be coupled to a common terminal 916. In an exemplary embodiment, the common terminal 916 may a ground connection. A gate 912 of the transistor 902 may be referred to as G1 and may be coupled to a gate voltage, VG1. A gate 911 of the transistor 904 may be coupled to a resistor 908 at node 907, may be referred to as G2, and may be coupled to a gate voltage, VG2. In an exemplary embodiment, the resistor 908 comprises a schematic representation of the parallel combination of resistances 662, 663, 664, 665, 666 and 667 mentioned in FIG. 6. A segment of polysilicon material 925 is illustrated above the resistor 908 to signify that the resistor 908 comprises a resistance created by one or more external sections of polysilicon between the gate 911 and the node 907 and corresponds to the parallel combination of external sections of polysilicon, not the active areas of the first gate segment 614, the second gate segment 624 and the third gate segment 634 that extend beyond the first gate segment 612 (G1), the second gate segment 622 (G2) and the third gate segment 632 (G1).

A capacitor 906 may be coupled between the node 907 and the common terminal 916. In an exemplary embodiment, the capacitor 906 comprises a schematic representation of the capacitances 682, 683, 684, 685, 686 and 687 mentioned in FIG. 6.

In an exemplary embodiment, the transistors 902 and 904 may be fabricated using a complementary metal oxide semiconductor (CMOS) manufacturing process.

The metal oxide semiconductor (MOS) transistor 902 (M1), high-voltage MOS transistor 904 (M2), resistor 508 and capacitor 506 may be part of the cascode structure 901 that may be defined within the single diffusion 401 (FIG. 4). The elements within the cascode structure 901 are formed on the single diffusion 410 of FIG. 4.

Figure 9B:
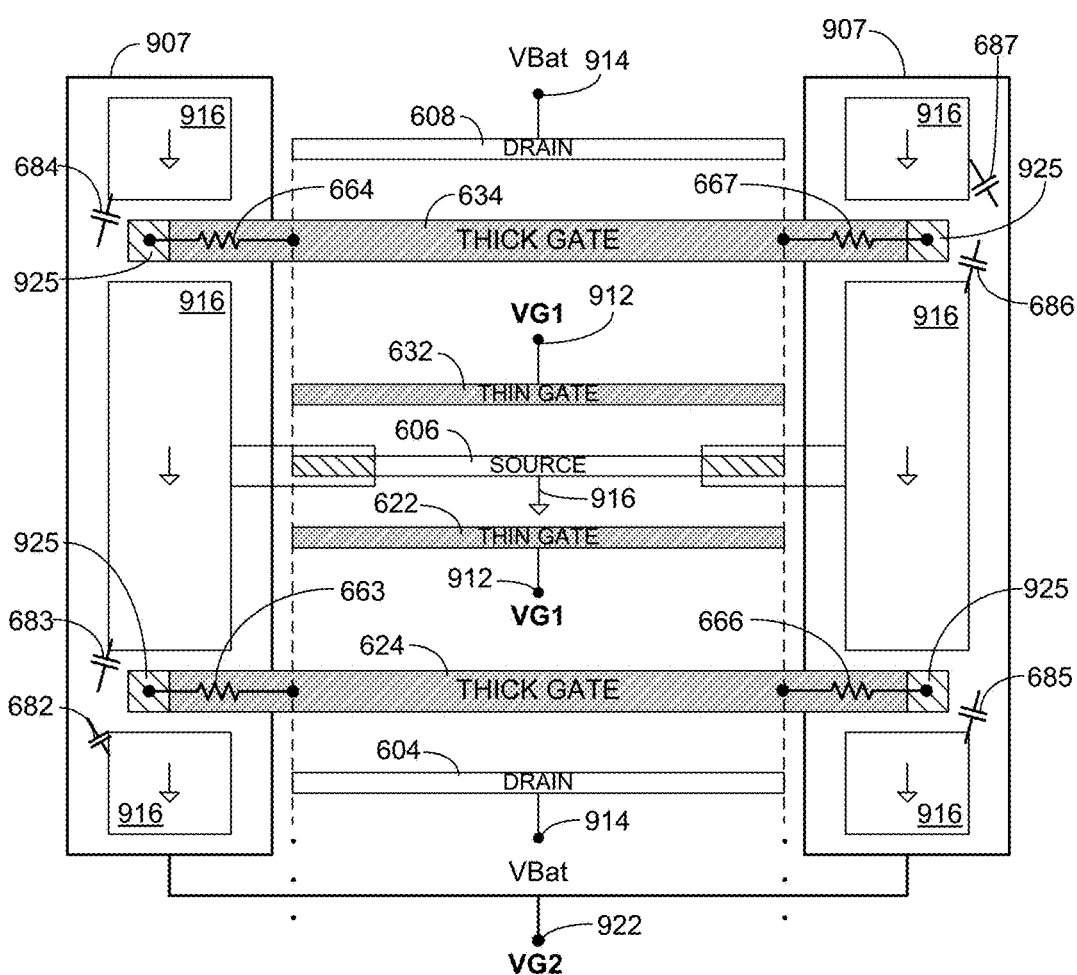
FIG. 9B is a schematic diagram illustrating an exemplary embodiment of a portion of the cascode transistor structure of FIG. 9A and FIG. 6.

FIG. 9B is a schematic diagram 950 illustrating an exemplary embodiment of a portion of the cascode transistor structure of FIG. 9A and FIG. 6. The node 907 is illustrated schematically as a structure configured to provide the gate voltage VG2 from the terminal 922 to the second gate segment 624 (G2) and the third gate segment 634 (G2). The gate voltage VG1 from node 912 is provided to the second gate segment 622 (G1) and the third gate segment 632 (G1). The first gate segment 612 (G1) and the first gate segment 614 (G2) are not shown in FIG. 9B. The highly doped N+ region 604 and the highly doped N+ region 608, which form the drain of the cascode structure 601 (FIG. 6) are shown being coupled to the voltage VBat on connection 914. The highly doped N+ region 606 that forms the source of the cascode structure 601 (FIG. 6) is shown as being coupled to the common terminal 916.

In accordance with an exemplary embodiment, the resistances 663, 664, 666 and 667, are illustrated as being formed by the external sections, or segments, of polysilicon material 925 that signify the resistance created between the gate 911 (not shown in FIG. 9B) and the node 907. The resistances 662 and 665 of FIG. 6 are not shown in FIG. 9B.

In alternative exemplary embodiments, variations on creating the resistances 663, 664, 666 and 667 (and other resistances not shown in FIG. 9B), may include coupling more than one gate segment (G2) together before adding the external polysilicon material to create the resistance. For example, in an alternative exemplary embodiment, the second gate segment 624 (G2) and the third gate segment 634 (G2) may be coupled together and then a polysilicon material may be added to the combined second gate segment 624 (G2) and third gate segment 634 (G2) to create the resistance.

In accordance with an exemplary embodiment, the capacitances 682, 683, 684, 685, 686 and 687 are illustrated as being created between the node 907 and the common terminal 916, using capacitors having one terminal coupled to each of the gate segments 614, 624 and 634, and the other terminal coupled to ground.

Figure 10:
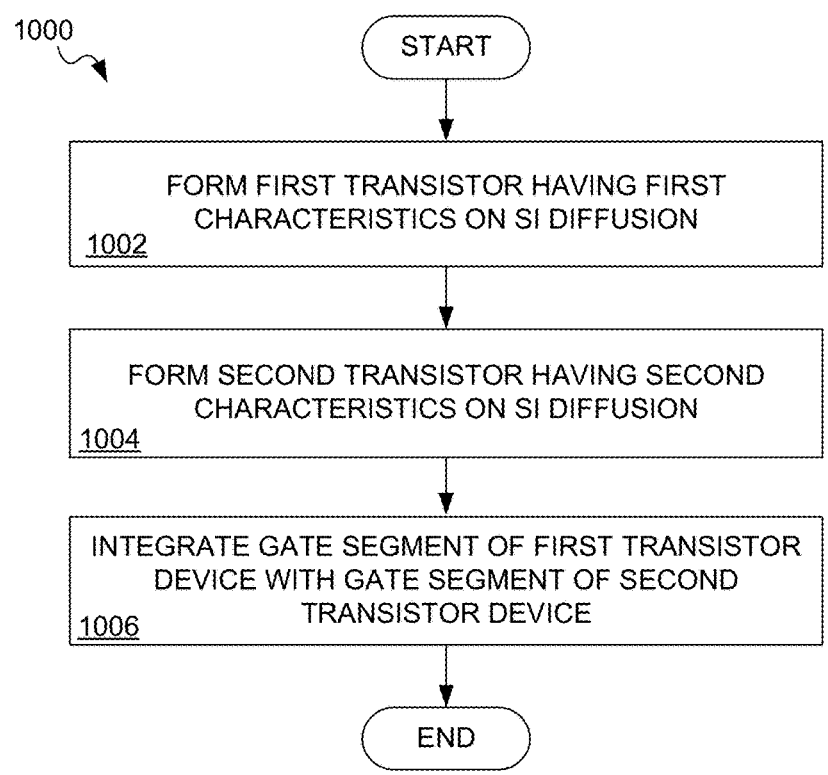
FIG. 10 is a flow chart describing the formation of an exemplary embodiment of a cascode radio frequency (RF) power amplifier on a single diffusion.

FIG. 10 is a flow chart 1000 describing the formation of an exemplary embodiment of a cascode radio frequency (RF) power amplifier on a single diffusion. The blocks in the method 1000 can be performed in or out of the order shown, and in some embodiments, can be performed at least in part in parallel.

In block 1002, a first transistor having first characteristics is formed on a silicon (Si) diffusion. In an exemplary embodiment, the first transistor may be one of two transistors coupled in a cascode structure. In an exemplary embodiment, the first transistor may be a transconductance NMOS transistor.

In block 1004, a second transistor having second characteristics is formed on the same silicon (Si) diffusion as the first transistor. In an exemplary embodiment, the second transistor may be one of two transistors coupled in a cascode structure. In an exemplary embodiment, the second transistor may be a high voltage NMOS transistor.

In block 1006, one or more gate segments of the first transistor are integrated with one or more gate segments of the second transistor, for example, by interdigitating the one or more gate segments. In an exemplary embodiment, interdigitating the one or more gate segments of the first transistor with one or more gate segments of the second transistor creates a cascode architecture on the single Si diffusion that occupies a minimal amount of area on the Si.

Figure 11:
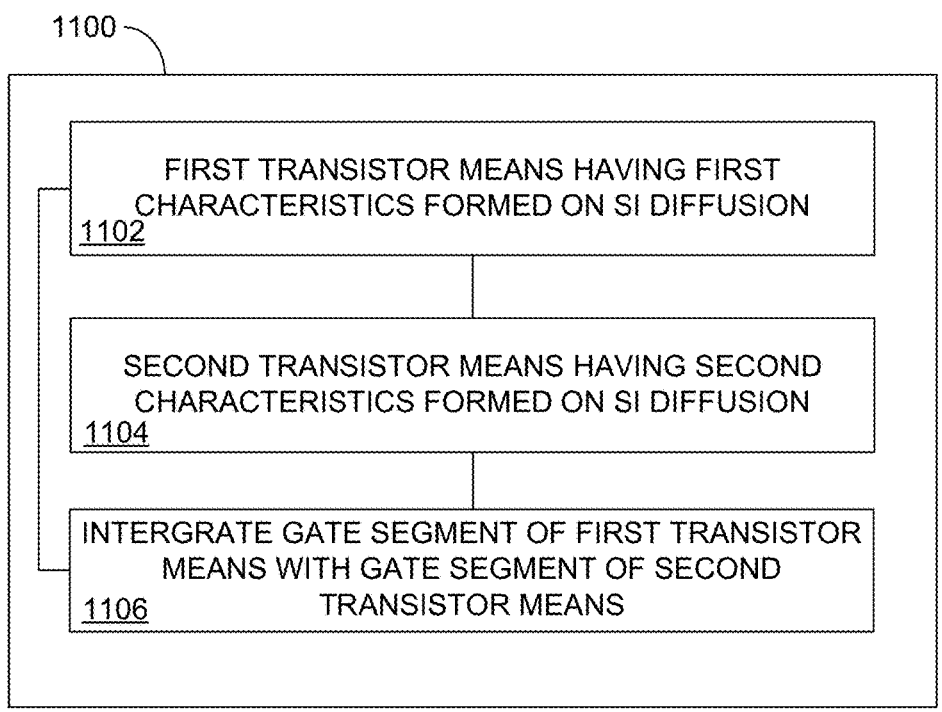
FIG. 11 is a functional block diagram of an apparatus for a cascode radio frequency (RF) power amplifier formed on a single diffusion.

FIG. 11 is a functional block diagram of an apparatus 1100 for a cascode radio frequency (RF) power amplifier on a single diffusion. The apparatus 1100 comprises means 1102 for a first transistor having first characteristics formed on a silicon (Si) diffusion.

In certain embodiments, the means 1102 for a first transistor having first characteristics formed on a silicon (Si) diffusion can be configured to perform one or more of the function described in operation block 1002 of method 1000 (FIG. 10). In an exemplary embodiment, the means 1102 for a first transistor having first characteristics formed on a silicon (Si) diffusion may comprise the cascode structure 601 and various embodiments thereof.

The apparatus 1100 further comprises means 1104 for a second transistor having second characteristics formed on a silicon (Si) diffusion can be configured to perform one or more of the function described in operation block 1004 of method 1000 (FIG. 10). In an exemplary embodiment, the means 1102 for a second transistor having second characteristics formed on a silicon (Si) diffusion may comprise the cascode structure 601 and various embodiments thereof.

The apparatus 1100 further comprises means 1106 for integrating a gate segment of the first transistor means with a gate segment of the second transistor means. In certain embodiments, the means 1106 integrating a gate segment of the first transistor means with a gate segment of the second transistor means can be configured to perform one or more of the function described in operation block 1006 of method 1000 (FIG. 10). In an exemplary embodiment, the means 1006 integrating a gate segment of the first transistor means with a gate segment of the second transistor means may comprise the cascode structure 601 and various embodiments thereof.

The embodiments of the cascode RF power amplifier, and cascode transistor architecture described herein can be configured to provide power amplification in a compact configuration, and on a single diffusion, to a variety of devices.

The cascode RF power amplifier, and cascode transistor architecture described herein described herein may be implemented on one or more ICs, analog ICs, RFICs, mixed-signal ICs, ASICs, printed circuit boards (PCBs), electronic devices, etc. The cascode RF power amplifier, and cascode transistor architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the cascode RF power amplifier, and cascode transistor architecture described herein described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. An amplifier, comprising:
a cascode structure comprising a first transistor having first characteristics coupled to a second transistor having second characteristics different than the first characteristics, the first transistor located with the second transistor on a single diffusion, the single diffusion having no intervening insulating layer separating the first transistor from the second transistor, the single diffusion comprising at least a P-type well region, a floating P body region having a P+ island, and a no well region having a native state of a silicon-on-insulator (SOI) layer on which the amplifier is located.

2. The amplifier of claim 1, wherein the first transistor is a transconductance N-type metal oxide semiconductor (NMOS) transistor.

3. The amplifier of claim 1, wherein the second transistor is a high-voltage N-type metal oxide semiconductor (NMOS) transistor.

4. The amplifier of claim 1, wherein a gate oxide thickness of the first transistor is different than a gate oxide thickness of the second transistor.

5. The amplifier of claim 1, wherein a channel length of the first transistor is different than a channel length of the second transistor.

6. The amplifier of claim 1, wherein:
a gate oxide thickness of the second transistor is thicker than a gate oxide thickness of the first transistor; and
a channel length of the second transistor is wider than a channel length of the first transistor.

7. The amplifier of claim 1, wherein a gate of the second transistor is wider than a gate of the first transistor, the gate of the second transistor comprising an additional segment forming a resistance associated with the gate of the second transistor.

8. The amplifier of claim 1, wherein a gate of the second transistor is wider than a gate of the first transistor, the gate of the second transistor having a capacitance associated with the gate of the second transistor.

9. The amplifier of claim 1, further comprising a floating diffusion covering a drain of the first transistor and a source of the second transistor, the floating diffusion comprising the floating P body region having the P+ island covering one side of the floating diffusion on the source side of the second transistor.

10. The amplifier of claim 9, wherein the P+ islands are interspersed with N+ material to tap the floating P body region.

11. The amplifier of claim 1, further comprising a lightly doped N-drift region covering the drain of the second transistor.

12. The amplifier of claim 11, wherein silicidation of the lightly doped N-drift region is blocked by a mask on a side of the drain of the second transistor.

13. A cascode amplifier, comprising:
a first transistor configured as a transconductance N-type metal oxide semiconductor (NMOS) transistor; and
a second transistor configured as a high-voltage N-type metal oxide semiconductor (NMOS) transistor, the first transistor and the second transistor located on a single diffusion, wherein a gate oxide thickness of the first transistor is different than a gate oxide thickness of the second transistor, the single diffusion having no intervening insulating layer separating the first transistor from the second transistor, the single diffusion comprising at least a P-type well region, a floating P body region having a P+ island, and a no well region having a native state of a silicon-on-insulator (SOI) layer on which the amplifier is located.

14. The amplifier of claim 13, wherein a channel length of the first transistor is different than a channel length of the second transistor.

15. The amplifier of claim 13, wherein a gate oxide thickness of the second transistor is thicker than a gate oxide thickness of the first transistor.

16. The amplifier of claim 13, wherein a channel length of the second transistor is wider than a channel length of the first transistor.

17. The amplifier of claim 13, wherein a gate of the second transistor is wider than a gate of the first transistor, the gate of the second transistor comprising an additional segment forming a resistance associated with the gate of the second transistor.

18. The amplifier of claim 13, wherein a gate of the second transistor is wider than a gate of the first transistor, the gate of the second transistor having a capacitance associated with the gate of the second transistor.

19. The amplifier of claim 13, further comprising a floating diffusion covering a drain of the first transistor and a source of the second transistor, the floating diffusion comprising the floating P body region having the P+ island covering one side of the floating diffusion on the source side of the second transistor.

20. The amplifier of claim 19, wherein the P+ islands are interspersed with N+ material to tap the floating P body region.

21. The amplifier of claim 13, further comprising a lightly doped N-drift region covering the drain of the second transistor.

22. The amplifier of claim 21, wherein silicidation of the lightly doped N-drift region is blocked by a mask on a side of the drain of the second transistor.

23. A cascode amplifier, comprising:
a first transistor configured as a transconductance N-type metal oxide semiconductor (NMOS) transistor; and
a second transistor configured as a high-voltage N-type metal oxide semiconductor (NMOS) transistor, the first transistor and the second transistor located on a single diffusion, wherein a channel length of the first transistor is different than a channel length of the second transistor, the single diffusion having no intervening insulating layer separating the first transistor from the second transistor, the single diffusion comprising at least a P-type well region, a floating P body region having a P+ island, and a no well region having a native state of a silicon-on-insulator (SOI) layer on which the amplifier is located.

24. The amplifier of claim 23, wherein a gate oxide thickness of the first transistor is different than a gate oxide thickness of the second transistor.

25. The amplifier of claim 23, wherein:
a gate oxide thickness of the second transistor is thicker than a gate oxide thickness of the first transistor; and
a channel length of the second transistor is wider than a channel length of the first transistor.

26. The amplifier of claim 23, wherein a gate of the second transistor is wider than a gate of the first transistor, the gate of the second transistor comprising an additional segment forming a resistance associated with the gate of the second transistor.

27. The amplifier of claim 23, wherein a gate of the second transistor is wider than a gate of the first transistor, the gate of the second transistor having a capacitance associated with the gate of the second transistor.

28. The amplifier of claim 25, further comprising:
a floating diffusion covering a drain of the first transistor and a source of the second transistor, the floating diffusion comprising the floating P body region having the P+ island covering one side of the floating diffusion on the source side of the second transistor, wherein the P+ islands are interspersed with N+ material to tap the floating P body region; and
a lightly doped N-drift region covering the drain of the second transistor, wherein silicidation of the lightly doped N-drift region is blocked by a mask on a side of the drain of the second transistor.

* * * * *